United States Patent
Akita et al.

[11] Patent Number: 6,144,599
[45] Date of Patent: Nov. 7, 2000

[54] SEMICONDUCTOR MEMORY DEVICE

[75] Inventors: Hironobu Akita, Yokohama; Kenji Tsuchida, Kawasaki, both of Japan

[73] Assignee: Kabushiki Kaisha Toshiba, Japan

[21] Appl. No.: 09/191,414

[22] Filed: Nov. 12, 1998

[30] Foreign Application Priority Data

Nov. 14, 1997 [JP] Japan ................................. 9-313709

[51] Int. Cl.[7] ............................................. G11C 11/419
[52] U.S. Cl. ........................ 365/203; 365/205; 365/207; 365/208; 365/190; 365/227
[58] Field of Search .................................. 365/205, 203, 365/230.01, 190, 207, 208, 226, 227

[56] References Cited

U.S. PATENT DOCUMENTS

| | | | |
|---|---|---|---|
| 5,274,746 | 12/1993 | Mashiko | 395/27 |
| 5,477,497 | 12/1995 | Park et al. | 365/205 |
| 5,499,211 | 3/1996 | Kirihata et al. | |
| 5,563,826 | 10/1996 | Pascucci et al. | 365/185.21 |
| 5,646,900 | 7/1997 | Tsukude et al. | 365/205 |
| 5,808,953 | 9/1998 | Kim et al. | 365/226 |
| 5,881,014 | 3/1999 | Ooishi | 365/276 |
| 5,901,102 | 5/1999 | Furutani | 365/226 |
| 5,949,731 | 9/1999 | Tsukude | 365/230.01 |

*Primary Examiner*—Viet Q. Nguyen
*Attorney, Agent, or Firm*—Hogan & Hartson, LLP

[57] ABSTRACT

In a DRAM semiconductor device comprising a bit line equalizer for setting a potential on paired bit lines to a potential on a precharge power source line, a sense amplifier circuit amplifying a potential difference across the paired bit lines and detecting data, sense amplifier drive lines, for applying a sense amplifier drive signal for driving the sense amplifier circuit to the sense amplifier circuit, and a sense amplifier/drive line equalizer, a current limiter element is so provided that, between a precharge power source line and the sense amplifier drive line, it is connected in series with the current path of the equalizer. By so providing the current limiter element, it is possible to, even if there occurs any cross-fail between the bit line and the word line, reduce a short-circuiting current at a precharging time or prevent generation of the short-circuiting current.

27 Claims, 13 Drawing Sheets

SEMICONDUCTOR MEMORY DEVICE

BACKGROUND OF THE INVENTION

The present invention relates to a semiconductor memory device including a bit line equalizer and sense amplifier drive line equalizer to precharge and equalize a bit line pair and sense amplifier line pair to predetermined potentials at an initial stage of a data access.

For example in the dynamic type semiconductor memory device, a bit line/word line short-circuiting defect, that is, a cross-fail defect, is liable to occur due to the microminiaturization and high integration density of elements. In order to improve a yield of the semiconductor devices, such defective bit lines and word lines are replaced by a repairing circuit (redundancy circuit) with corresponding spare bit lines and word lines. However, these defective bit lines and word lines are not electrically separated and, at a precharging time, that is, at an initial stage of a data access time, a bit line precharging voltage (for example, Vcc/2) and word line non-select voltage (for example, Vss=0V) are precharged onto these defective bit lines and word lines. For this reason, a short-circuiting current flows into the cross-fail area at the precharging time, thus resulting in an increase in a standby current at the precharging time.

In order to solve such a problem, a proposal has been made to provide a current limiter element between the bit line equalizer circuit and the bit line precharging power source line (for example, Vcc/2)—see the specification of U.S. patent application Ser. No. 5,499,211, Mar. 12, 1996.

FIG. 13 shows a portion of a circuit arrangement illustrated in the above U.S. Patent. In FIG. 13, a plurality of bit line pairs BL, bBL (bBL: a logically inverted version of BL) and plurality of word line WL (in FIG. 13, only one word line is shown) are shown in an intersecting relation.

In FIG. 13 are shown a bit line equalizer array comprised of a plurality of bit line equalizers 1 and a sense amplifier circuit array comprised of a plurality of sense amplifiers 2.

In the respective bit line equalizer, three N-channel MOS transistors Q1 to Q3 are supplied at their gates with a bit line equalizer signal on a corresponding bit line equalizer control line 3. The MOS transistors Q1 to Q3 in the respective bit line equalizer circuit 1 are so controlled as to be turned ON at the precharging time, that is, at the initial stage of the data access time. By doing so, a potential on the bit line pair corresponding to the bit line equalizer 1 is set to a precharge voltage level (for example, Vcc/2). By doing so, it is possible to accomplish the precharging and equalizing of the voltage on the bit line pair.

Here, in the case where, at the precharging time, any cross-fail occurs between the precharging power source line 4 and the bit line equalizer array, a current limiter element 5 provided for this purpose serves to reduce a short-circuiting current from the bit line to the word line.

Further, the respective sense amplifier circuit 2 comprises a P-channel sense amplifier comprising two P-channel MOS transistors Q4, Q5 and an N-channel sense amplifier comprising two N-channel MOS transistors Q6, Q7. The sources of the P-channel MOS transistors Q4, Q5 are connected to a common junction which is connected to a P-channel sense amplifier drive signal 6 for driving the P-channel sense amplifier. Similarly, the sources of the N-channel MOS transistors Q6, Q7 are connected to a common junction which is connected to an N channel sense amplifier drive line 7.

A sense amplifier drive line equalizer 8 is connected to the sense amplifier drive lines 6 and 7. The sense amplifier drive line equalizer 8 comprises three N-channel MOS transistors Q8 to Q10 whose gates are controlled by an equalizing signal supplied to the sense amplifier drive line/equalizer control line. The MOS transistors Q8 to Q10 in the sense amplifier drive line equalizer 8 is so controlled as to be turned ON at the precharging time, that is, at the initial stage of the data access time. By doing so, a voltage on the sense amplifier drive line pair (6, 7) is set to a precharging voltage (for example, Vcc/2) on the precharging power source line 10. In this way, it is possible to accomplish the precharging and equalizing of the voltage on the sense amplifier drive line pair (6, 7).

Even when, however, such current limiter element 5 is provided, if any cross-fail occurs, a current flows through paths set out below at the precharging time.

(1) A charge on the bit line BL flows past the cross-fail portion (circle in FIG. 13) onto a word line WL set to a word line non-select voltage (Vss=0V) level (① in FIG. 13).

(2) A current, flowing from the bit line BL at the path ①, flows past a turned-ON N-channel MOS transistor Q1 in the bit line equalizer 1 and into the bit line BL from the bit line bBL as a pair relative to the bit line BL, so that potentials on the bit lines BL, bBL are lowered both to a near-Vss level (② in FIG. 13).

(3) A charge for precharging the P-channel sense amplifier drive line 6 flows through the bit line BL after passing through the P-channel MOS transistor Q4 in the sense amplifier 2 (③ in FIG. 13).

(4) Through the N-channel MOS transistor Q9 in the sense amplifier drive line equalizer 8 a current flows from the precharging current source line 10 into the P-channel sense amplifier drive line (④ in FIG. 13).

Even in the DRAM semiconductor device of FIG. 13, a current flows from the precharging power source line 10 (precharging the P-channel sense amplifier drive line 6) into the word line WL through the sensor amplifier drive line equalizer 8, P-channel sense amplifier drive line 6, sense amplifier 2, bit line BL and cross-fail area, so that a standby current is increased at the precharging time.

BRIEF SUMMARY OF THE INVENTION

It is accordingly the object of the present invention to provide a semiconductor memory device which, even if any cross-fail occurs across a bit line and a word line, can reduce a short-circuiting current at a precharging time, or prevent the generation of a short-circuiting current, and reduce a standby current.

In one aspect of the present invention, there is provided a semiconductor memory device comprising:

paired bit lines;

a bit line equalizer for setting a potential on the paired bit lines to a first potential;

a sense amplifier circuit, connected to the paired bit lines, for amplifying a potential difference on the paired bits and detecting data;

paired drive signal lines for transmitting a sense amplifier drive signal which drives the sense amplifier circuit to the sense amplifier circuit;

a drive signal line equalizer for setting the potential on the paired drive signal line to a second potential; and a current limiter element which, between a power potential source of the second potential and the paired drive signal lines, is connected in series with a current path of the drive signal line equalizer.

The current limiter element may have its operation controlled in accordance with a control signal. The control signal may be a column select signal.

According to another aspect of the present invention, there is provided a semiconductor memory device comprising:

paired bit lines;

a bit line equalizer for setting a potential on the paired bit lines to a first potential;

a sense amplifier circuit connected to the paired bit lines and having a P-channel sense amplifier comprised of P-channel MOS transistors and an N-channel sense amplifier comprised of N-channel MOS transistors, the sense amplifier circuit amplifying a potential difference created between the paired bits and detecting data;

a first drive signal line for transmitting a first drive signal driving the P-channel sense amplifier to the P-channel sense amplifier;

a second drive signal line for transmitting a second drive signal driving the N-channel sense amplifier to the N-channel sense amplifier;

a drive signal line equalizer including a first MOS transistor having a source/drain current path inserted between the first drive signal line and a second drive signal line and so controlled as to be turned ON, only during an initial given portion of a precharging period, by a third drive signal supplied to a gate thereof, a second MOS transistor having a source/drain current path inserted between the first drive signal line and a second potential source of the second potential and supplied at a gate with a fourth drive signal, and a third MOS transistor having a source/drain current inserted between the second drive signal line and a power potential source of the second potential and supplied at a gate with the fourth drive signal; and a current limiter element which, between the first drive signal line and the potential source of the second potential, inserted in series with a source/drain current path of the second MOS transistor. Between the first drive signal line and the second drive signal, a rectifier element may be connected in series with the source/drain current path. In order to prevent an overlap of ON periods of the second and third MOS transistors with an ON period of the first MOS transistor, the fourth drive signal may be supplied to the gates of the second and third MOS transistors.

According to still another aspect of the present invention, there is provided a semiconductor memory device comprising:

paired bit lines;

a bit line equalizer for setting a potential on the paired line pair to a first potential;

a sense amplifier circuit connected to the paired bit lines and having a P-channel sense amplifier of P-channel MOS transistors and N-channel sense amplifiers of N-channel MOS transistors, the sense amplifier circuit amplifying a potential difference across the paired bit lines and detecting data;

a first drive signal line for transmitting a first drive signal for driving the P-channel sense amplifier to the P-channel sense amplifier;

a second drive signal line for transmitting a second drive signal for driving the N-channel sense amplifier to the N-channel sense amplifier;

a drive signal line equalizer including a first MOS transistor having a source/drain current path connected between the first drive signal line and the second drive signal line, a second MOS transistor having a source/drain current path connected between the first drive signal line and a potential source of the second potential and supplied at a gate with a third drive signal, a third MOS transistor having a source/drain current path connected between the second drive signal line and the potential source of the second potential and supplied at a gate with a third drive signal and a logic circuit driving the gate of the first MOS transistor in accordance with the third drive signal and a signal on the first drive signal line and generating a fourth drive signal; and a current limiter element which, between the first drive signal line and the potential source of the second potential, is connected in series with the source/drain current path of the second MOS transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained below with reference to the accompanying drawing.

Figure 1:
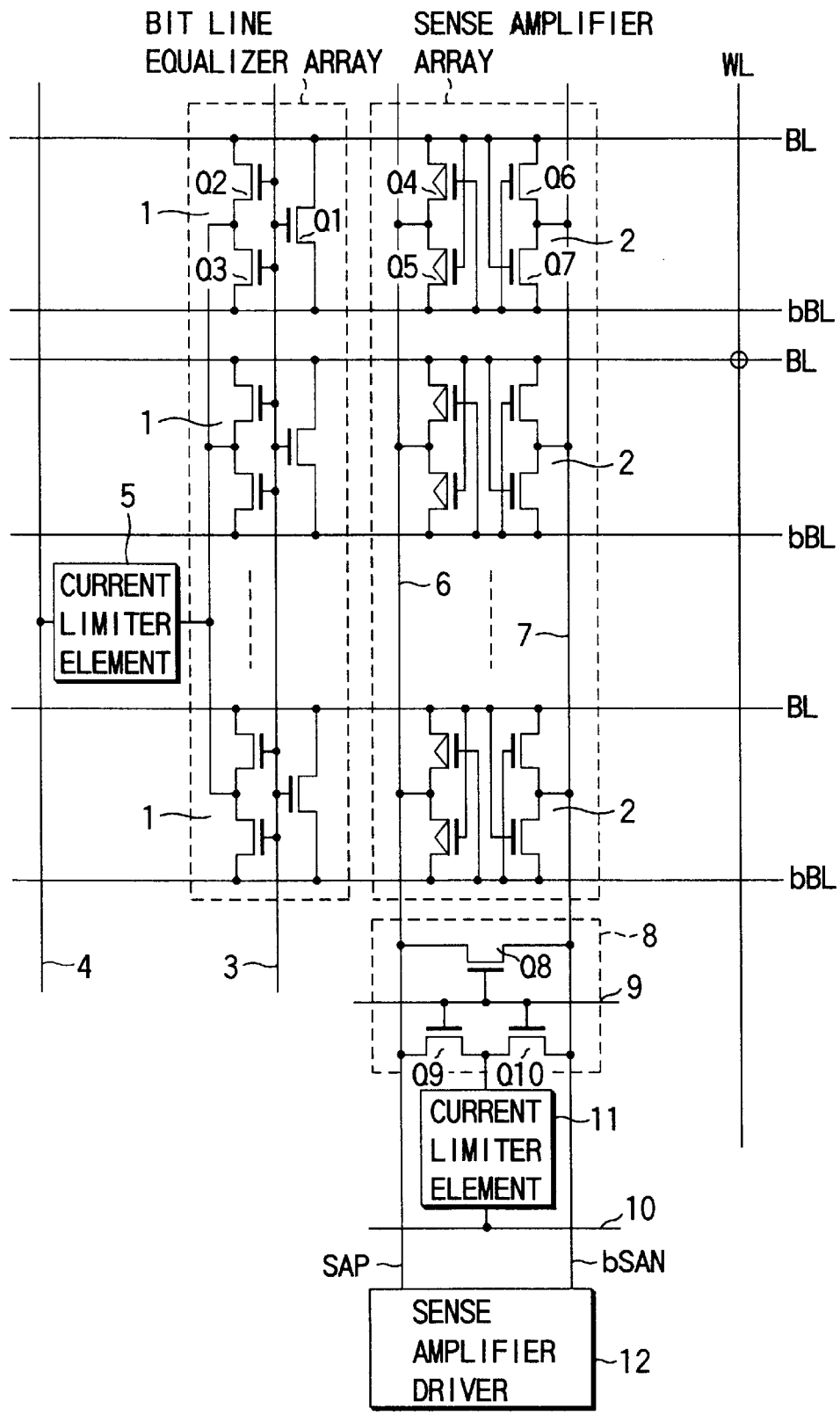
FIG. 1 is a view showing a circuit arrangement of a portion of a DRAM according to a first embodiment of the present invention.

FIG. 1 shows an arrangement of a portion of a first embodiment of the present invention. In FIG. 1, the same reference numerals are employed to designate parts or elements corresponding to those shown in FIG. 13.

In FIG. 1, BL, bBL show a bit line pair and WL shows a word line. A plurality of bit line pairs BL, bBL and plurality of word lines (only one is shown in FIG. 1) are arranged in a crossed way. A plurality of memory cells are connected to respective bit line pairs BL, bBL, though not shown in FIG. 1 in detail.

A bit line equalizer circuit array is comprised of a plurality of bit line equalizers 1 and a sense amplifier circuit array is comprised of a plurality of sense amplifier circuits 2.

The respective bit line equalizer circuit 1 comprises three N-channel MOS transistors Q1 to Q3 whose gates are controlled by a bit line equalizing signal supplied on the bit line equalizing control line 3. That is, the source/drain current path of the MOS transistor Q1 is connected between the bit line BL and the corresponding bit line bBL and has its gate connected to the bit line equalizing control line 3. The source/drain current paths of the MOS transistors Q2 and Q3 are connected between the corresponding bit pair and have their gates connected to the bit line equalizing control line 3. The MOS transistors Q2 and Q3 have their current paths connected at their common junction. The junction of the current paths of the MOS transistors Q2 and Q3 in a respective bit line equalizing circuit 1 provides a junction common among these respective MOS transistors Q2 and Q3 of the respective bit line equalizer circuits. A current limiter element 5 is connected between that common junction and the precharging power line 4.

A precharging voltage (for example, Vcc/2) for setting a predetermined voltage on all bit lines at a precharging time, that is, at an initial stage at a data access time is applied to the precharging power source line 4.

The respective sense amplifier 2 comprises a P-channel sense amplifier comprised of two P-channel MOS transistors Q4, Q5 and an N-channel sense amplifier comprised of two N-channel MOS transistors Q6, Q7. That is, the source/drain current paths of the P channel MOS transistors Q4, Q5 in the respective P-channel sense amplifier are connected in a series array between the corresponding bit line pair. Further, the gate of the MOS transistor Q4 is connected to the bit line bBL in one of a pair and the gate of the MOS transistor Q5 is connected to the bit line BL in the other of the pair. A common junction of the source/drain current path of the MOS transistors Q4, Q5 is connected to a P-channel sense amplifier drive line 6.

The source/drain current paths of the two N-channel MOS transistors Q6, Q7 in the respective N-channel sense amplifier are connected, like the P-channel sense amplifier, in a serial array between the bit line pair. The gate of the MOS transistor Q6 is connected to the bit line bBL and the gate of the MOS transistor Q7 is connected to the bit line BL. A common junction of the current paths of the MOS transistors Q6, Q7 is connected to an N-channel sense amplifier drive line 7.

A sense amplifier drive line equalizer 8 is connected to the sense amplifier drive lines 6 and 7. The sense amplifier drive line equalizer 8 comprises three N-channel MOS transistors Q8 to Q10 having their gates controlled by an equalizing signal supplied through a sense amplifier drive line equalizing control line 9. That is, the source/drain current path of the MOS transistor Q8 is connected between the sense amplifier drive lines 6 and 7 and the gate of the MOS transistor Q8 is connected to the sense amplifier drive line equalizing control line 9. The MOS transistors Q9, Q10 have their source/drain current paths connected in a serial array between the sense amplifier drive lines 6 and 7 and their gates connected to the sense amplifier drive line equalizing control line 9.

The present embodiment (FIG. 1) and the conventional counterpart (FIG. 13) are different from each other in that a current limiter element 11 is provided relative to the sense amplifier drive line equalizer 8 and a common junction of the current paths of two MOS transistors Q9, Q10 in the sense amplifier drive line equalizer 8 is connected through the current limiter element 11 without being connected directly to a precharging power source line 10 of a sense amplifier drive line. That is, between the precharging power source line 10 and the sense amplifier drive line 6, the current limiter element 11 is connected in a serial array to the current path of the sense amplifier drive line equalizer 8. The current limiter element 11 serves to limit, to below a given level, an electric current flowing from a precharging voltage (for example, Vcc/2) source of the precharging power source line 10.

Further, the sense amplifier drive circuit 12 is connected between the sense amplifier drive lines 6 and 7. During the operation period following the precharging and equalizing operations of the sense amplifier drive lines 6, 7 by the sensor amplifier drive line equalizer, the sense amplifier drive circuit 12 generates drive signals SAP and bSAN for driving (activating) the P- and N-channel sense amplifiers in the respective sense amplifier circuit 2. In this connection it is to be noted that the drive signals SAP and bSAN at the driving (activating) time have logical levels "H" and "L", respectively.

Figure 13:
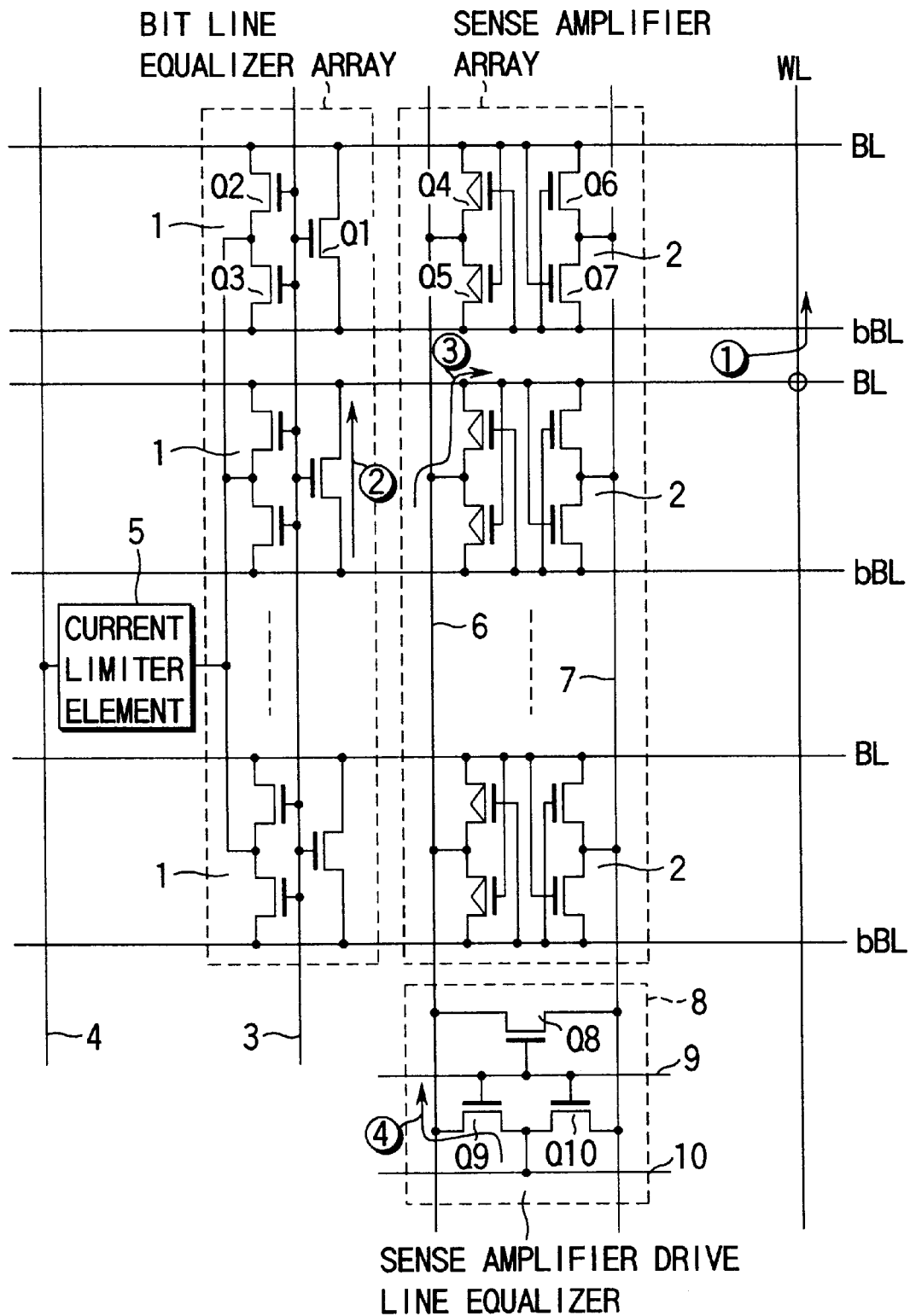
FIG. 13 is a circuit diagram showing a portion of a conventional DRAM semiconductor device.

An explanation will be given below about the operation of the precharge period in the case where, in such an arrangement, a cross-fail occurs at a circuit indicated by the circle in FIG. 13. It is to be noted that, during this precharging period, signals on the bit line equalizing control line 3 and sense amplifier drive line equalizing control line 9 become "H" levels and that the word lines WL are set all in the non-select voltage (Vss=0V).

When the signal on the bit line equalizing control line 3 is at the "H" level, the respective bit line equalizer 1 is operated and the respective bit line pair BL, bBL is precharged/equalized by the precharge voltage on the precharge power source line 4. Similarly, when a signal on the sense amplifier drive line equalizing control line 9 is at the "H" level, the sense amplifier drive line equalizer 8 is operated and the P- and N-channel sense amplifier drive lines 6 and 7 are precharged/equalized by a precharging voltage on the precharging power source line 10.

At this time, as already explained above, a short-circuiting flows from the bit line BL through the cross-fail area into the word line WL. Since, however, the current limiter element 5 is provided between the precharging power source line 4 and the bit line equalizer array, a value of a current flowing from the precharge power source line 4 is restricted to below a given level.

On the other hand, an electric current flows from the bit line BL through the cross-fail area into the word line WL and, together with this, a potential on the bit line bBL is made low and, as already set out above in connection with the conventional circuit, a short-circuiting current flows into the P-channel sense amplifier drive line 6 from the precharge power source line 10.

Since, in this embodiment (semiconductor device in FIG. 1), the current limiter element 11 is provided between the precharge power source line 10 and the sense amplifier drive line equalizer 8, the short-circuiting current flowing from the precharge power source line 10 to the P channel sense amplifier drive line 6 is restricted to below a given level.

In this way, in the DRAM semiconductor device of FIG. 1, the current limiter element (current limiter elements 5, 11 in this embodiment) is provided in all paths via which any short-circuiting current may be flowed during the precharging time. Even if, in this case, there occurs any cross-fail, it is possible to reduce a standby current at the precharging time.

Since, against a plurality of bit line pairs, a single current limiter element 11 has only to be provided, the addition of such current limiter element involves almost no increase in that area taken up by it on a semiconductor chip and the current limiter elements 5 and 11 may be comprised of the same arrangement.

Although, in the above-mentioned DRAM, the bit line equalizer 1 and sense amplifier drive line equalizer 8 have been explained as being comprised of N-channel MOS transistors, they may be comprised of P-channel MOS transistors or be comprised of N- and P-channel MOS transistors.

Figure 2A:
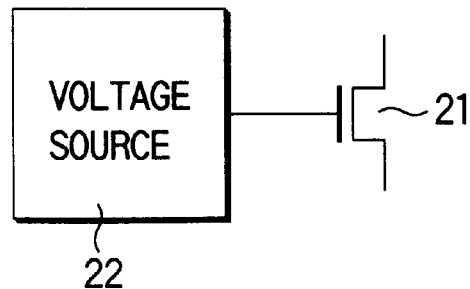
FIGS. 2A to 2C, each, is a view showing a practical form of a current limiter element for use in the DRAM semiconductor device.
Figure 2B:
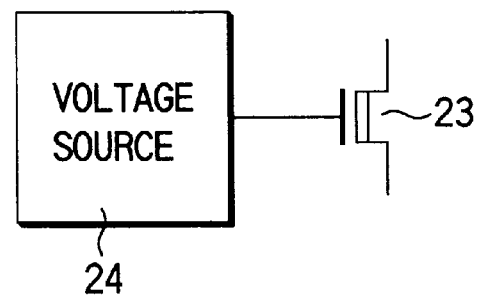
Figure 2C:
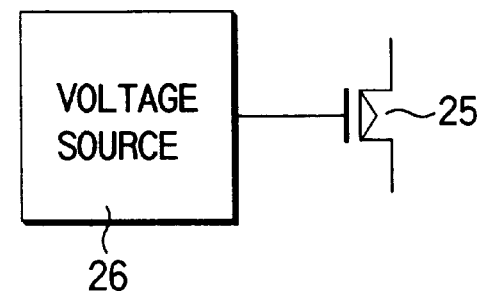

FIGS. 2A, 2B and 2C, each, show a practical arrangement of the current limiter element 5 or 11 used in the DRAM semiconductor device in FIG. 1. The current limiter element shown in FIGS. 2A, 2B and 2C are of the simplest arrangement and utilize the characteristic of a pentode area of the MOS transistor. The practical arrangement as shown in FIG. 2(A) uses, as the MOS transistor, an N-channel enhancement type MOS transistor and a bias voltage from a voltage source 2 is supplied to the gate of the MOS transistor 21. The practical arrangement as shown in FIG. 2B uses, as the MOS transistor, an N-channel depletion type MOS transistor 23 and a bias voltage from a voltage source 24 is supplied to the gate of the MOS transistor 23. The practical arrangement as shown in FIG. 2C uses, as the MOS transistor, a P-channel enhancement type MOS transistor 25 and a bias voltage from a voltage source 26 is supplied to the gate of the MOS transistor 25.

Even in the case of any of these current limiter elements as shown in FIGS. 2A and 2C, a current flowing through the source/drain path of the MOS transistor can be restricted to a predetermined level by adjusting the element size (channel width for instance) and/or the gate bias current level.

Figure 3:
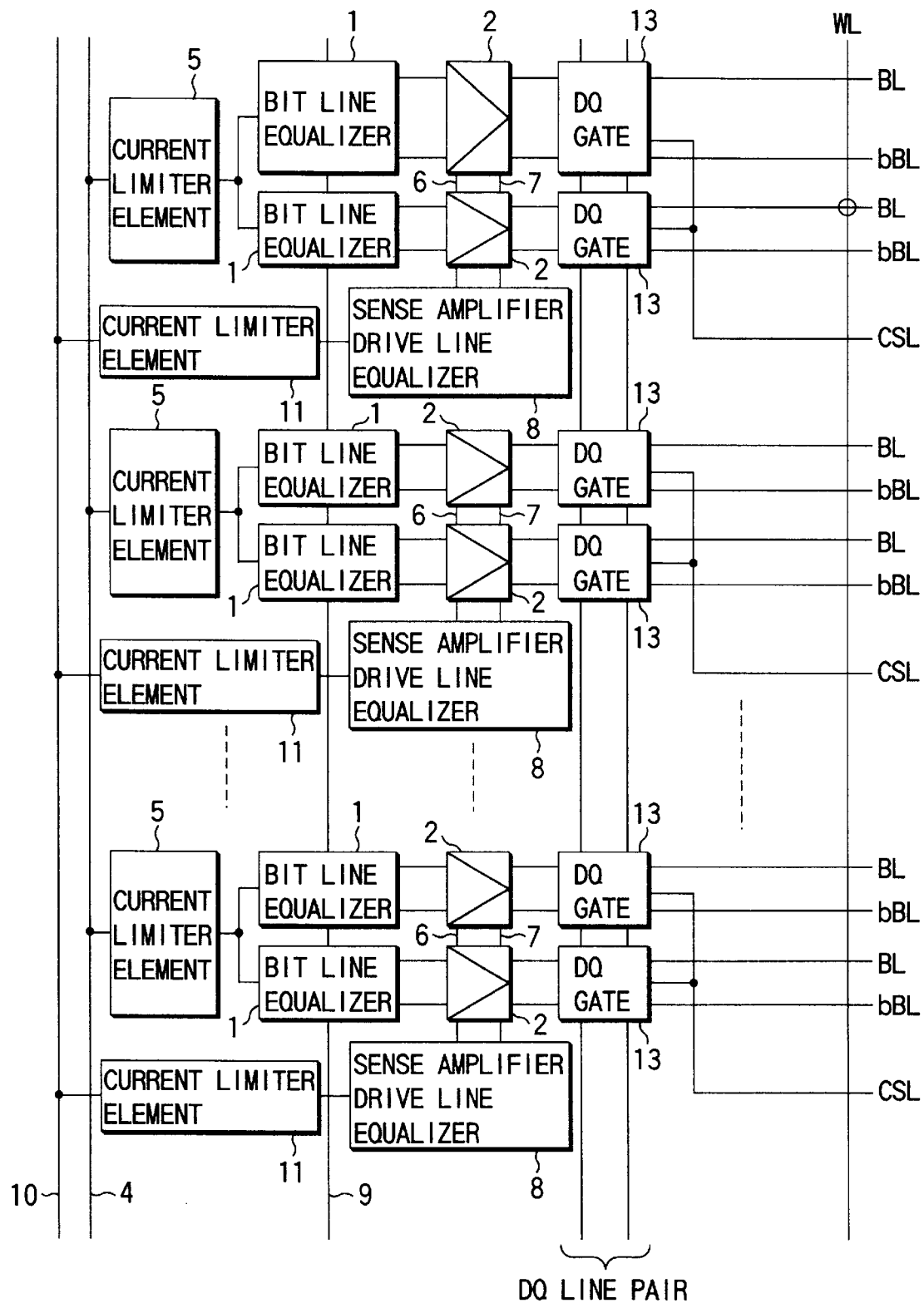
FIG. 3 is a block diagram showing a DRAM semiconductor device according to second embodiment of the present invention.

FIG. 3 is a block diagram showing a DRAM semiconductor device according to a second embodiment of the present invention. In the DRAM semiconductor device, a plurality of bit line pairs are of such a type as to be blocked at each given number (two pairs in this embodiment) of bit line pairs with memory cells (not shown) blocked in a manner to correspond to the bit line pair block. Further, a spare memory cell block (not shown) for redundancy is provided for each bit line pair block. That is, P- and N-channel sense amplifier drive lines 6 and 7 are independently provided for each bit line pair block and the sense amplifier drive line equalizer 8 and current limiter elements 5, 11 are provided for each bit line pair block. And any memory cell block, if a cross-fail is present there, is replaced with a corresponding spare memory cell block for redundancy.

Column select DQ gates 13 are provided for each bit line pair block and a column select signal CSL is supplied to the corresponding DQ gates 13. The DQ gates 13 are selectively turned ON by the column select signal CSL and, through the DQ gate 13, data on the line pair is transferred to a plurality of DQ line pair.

By independently providing the P- and N-channel sense amplifier drive lines 6 and 7and sense amplifier drive line equalizer 8 for each bit line pair block, the sense amplifier drive lines 6 and 7 in a normal bit line block can achieve the reduction of a standby current without suffering any adverse effect from the sense amplifier drive lines in any defective bit line block.

It is to be noted that, in the DRAM semiconductor device of this embodiment, the current limiter element 11 is provided for each bit line block. For this reason, more current limiter elements 11 are needed than in the first embodiment (FIG. 1). In spite of this fact, only one current limiter element 11 may be needed for the predetermined number of bit line pairs in the respective bit line and much less area is needed on the semiconductor substrate.

Although, in the DRAM semiconductor device of the above-mentioned embodiment, a remedial unit is per two columns (two bit line pairs), it may be per column. Although, in the DRAM semiconductor device of the present embodiment, the respective bit line pair block has been explained as being selected with an individual column select signal CSL, it may be possible to select a plurality of bit line pair block with one column select signal CSL.

Figure 4:
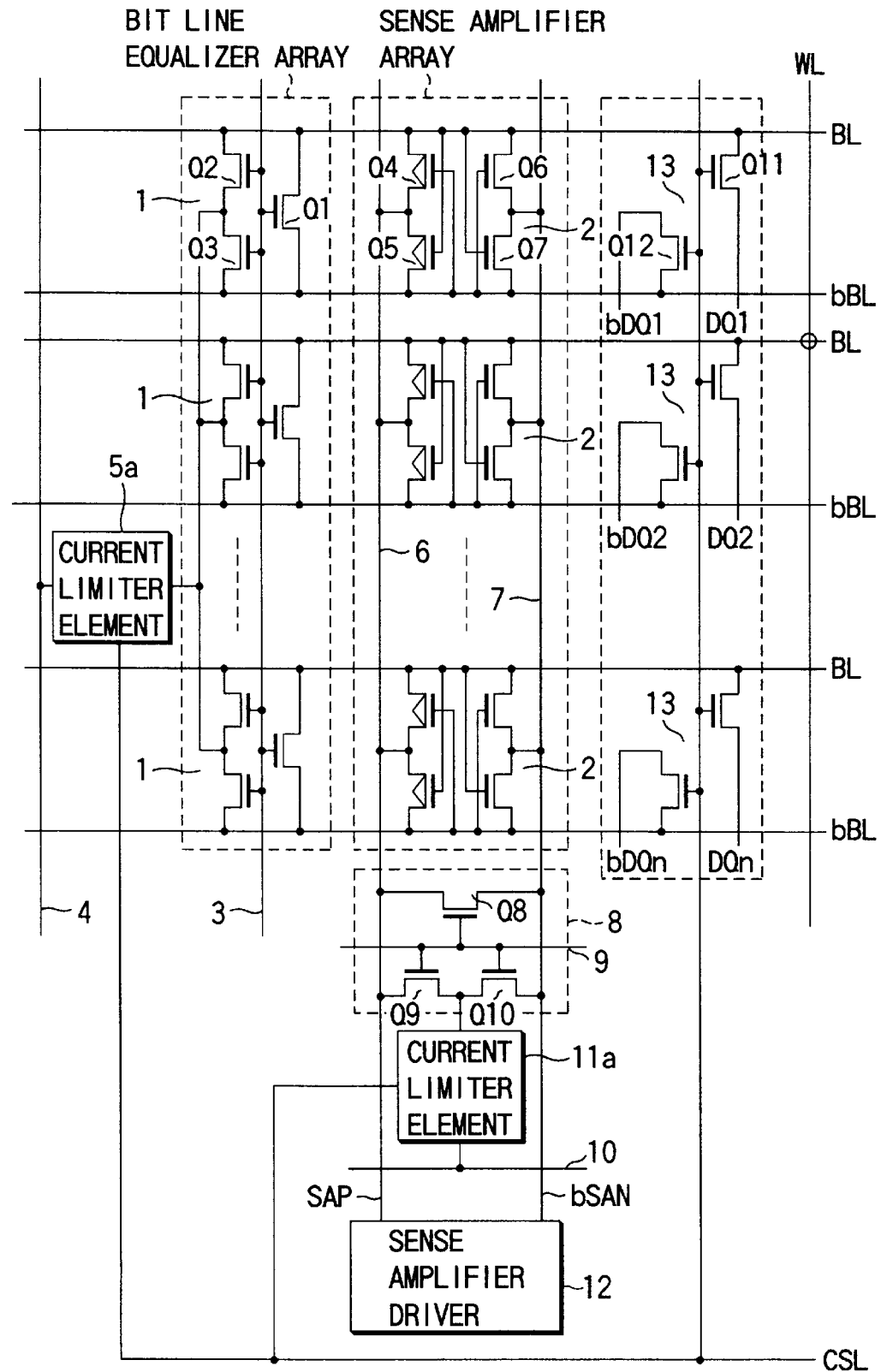
FIG. 4 is a circuit diagram showing a portion of a DRAM semiconductor device according to a third embodiment of the present invention.

FIG. 4 shows an arrangement of a portion of a DRAM semiconductor device according to a third embodiment of the present invention. Instead of the current limiter elements 5, 11 in FIG. 1, current limiter elements 5$a$, 11$a$ are provided for allowing their operations to be controlled in accordance with a control signal. In this embodiment, the same reference numerals are employed to designate parts or elements corresponding to those shown in FIGS. 1 and 3 except in the current limiter elements 5$a$ and 11$a$.

Here, a DQ gate 13 is provided for each bit line pair and comprised of two N-channel MOS transistors Q11, Q12. A source/drain current path of the MOS transistor Q11 is connected between a bit line BL of a corresponding bit pair and a corresponding DQ line DQi (i=1, 2, . . . , n) and a source/drain current path of the MOS transistor Q12 is connected between a bit line bBL of a corresponding bit line pair and a DQ line bDQ1. A column select signal CSL is commonly connected to the gate of all MOS transistors Q11, Q12.

The column select signal CSL is used as a control signal for controlling the operations of the current limiter elements 5$a$, 11$a$. The column select signal CSL has not only a "H" (Vcc) and a "L" (Vss) level but also a third level Vx as will be set out below.

The respective current limiter elements 5$a$ and 11$a$ are operated when the column select signal CSL is at the "H" (Vcc) and "L" (Vss) levels and not operated when the column select signal is at the third level Vx in which case a current flowing through these current limiter elements becomes nearly zero.

Where there exists any cross-fail at a site as indicated by the circle marks for example, the column select signal CSL is set to the third level Vx. By doing so, the current limiter elements 5a and 11a are not operated even at the precharging time. And there is neither a flow of any short-circuiting resulting from a cross-fail nor a flow of a precharging current. Needless to say, it is necessary, in this case, to replace a whole circuit as shown in FIG. 4 as a remedial unit with a redundancy circuit.

Figure 5:
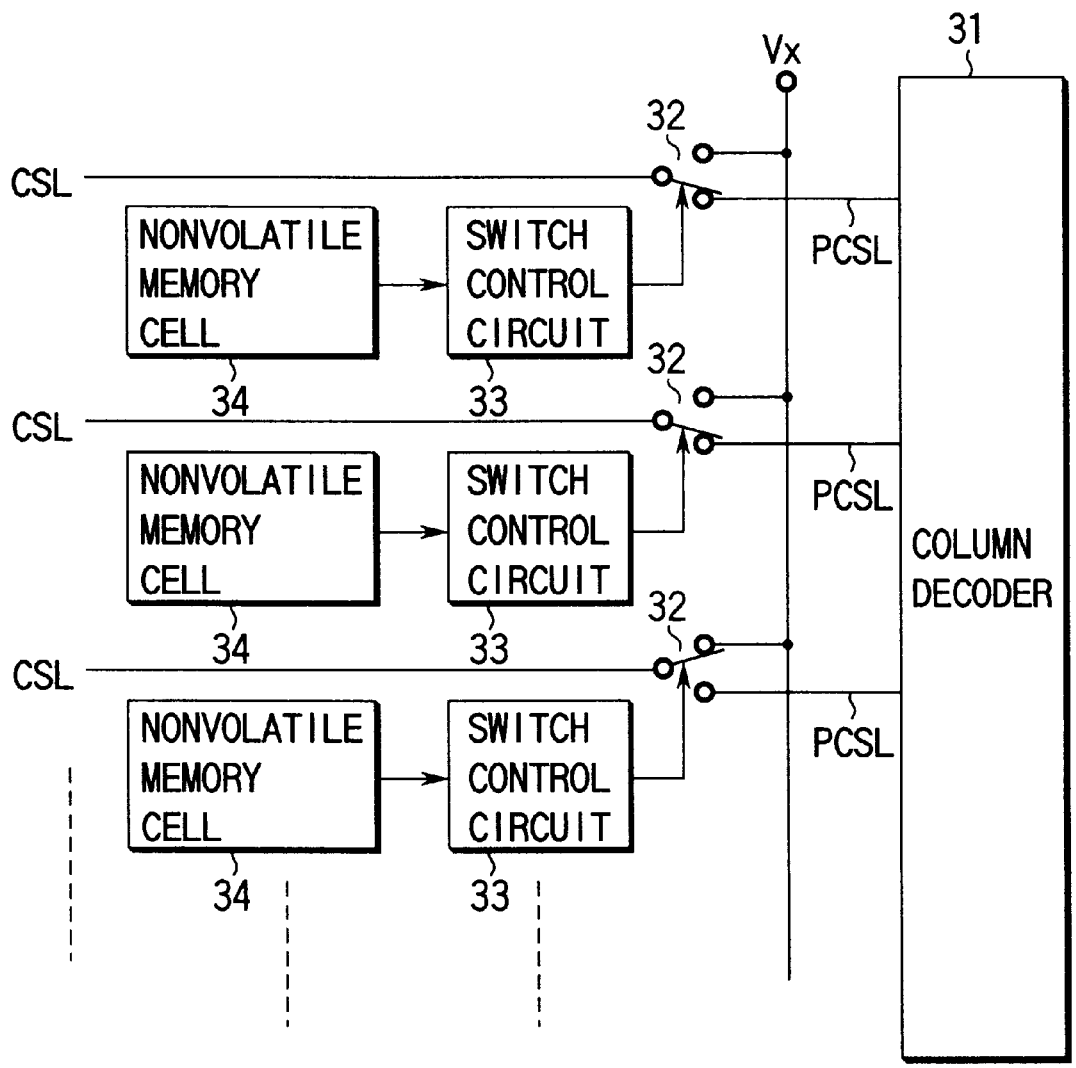
FIG. 5 shows a practical form of a circuit for generating three column select signals of different levels to be input to the DRAM semiconductor device of FIG. 4.

FIG. 5 shows a practical circuit arrangement for generating column select signals CSL having the three levels "H", "L" and Vx and FIG. 4. In FIG. 5, a column decoder 31 generates, based on a column address signal (not shown), column select signals PCSL having the levels "H" (Vss) and "L" (Vss). Further, 32, 32, . . . show switch circuits for selecting the column select signals having the above-mentioned two levels and third level Vx and providing them as column select signals CSL to the corresponding column select lines.

The switch circuit 32 switches the signals under the control of a respective switching control circuit 33 and a nonvolatile memory element 34 is provided for each switching control circuit 33. As these nonvolatile memory elements 34 use is made of nonvolatile memory elements programmable after the fabrication of a semiconductor chip, for example, polysilicon layers worked with a laser beam, fuses on interconnect metal layers, and PROM cells. After the formation of a chip, tests are made for operation and information is stored in a nonvolatile memory element 34 corresponding to a column involving a cross-fail.

In FIG. 5, if, for example, a cross-fail is present at a column corresponding to a third column line from top, corresponding information is programmed in a corresponding nonvolatile memory element 34 (nonvolatile memory element 34 at a third column select line from top in FIG. 5). By doing so, a corresponding switch circuit 32 (switch circuit 32 at a third column select line from top in FIG. 5) is so controlled as to select the third level Vx. And the current limiter elements 5a, 11a in the FIG. 4 circuit block supplied with a column select signal CSL of a third level Vx fails to operate.

On the other hand, the other switch circuits 32 are so controlled as to select the column select signals PCSL of the "H" or "L" and the current limiter elements 5a, 11a in the other circuit blocks (not shown in FIG. 4) supplied with the column select signals PCSL of the "H" or "L" become operative states.

Where the depletion type N-channel MOS transistors are used as the current limiter elements 5a and 11a, it follows that such a negative voltage as to cut off the depletion-type N-channel MOS transistor is set as the third level Vx.

Figure 6:
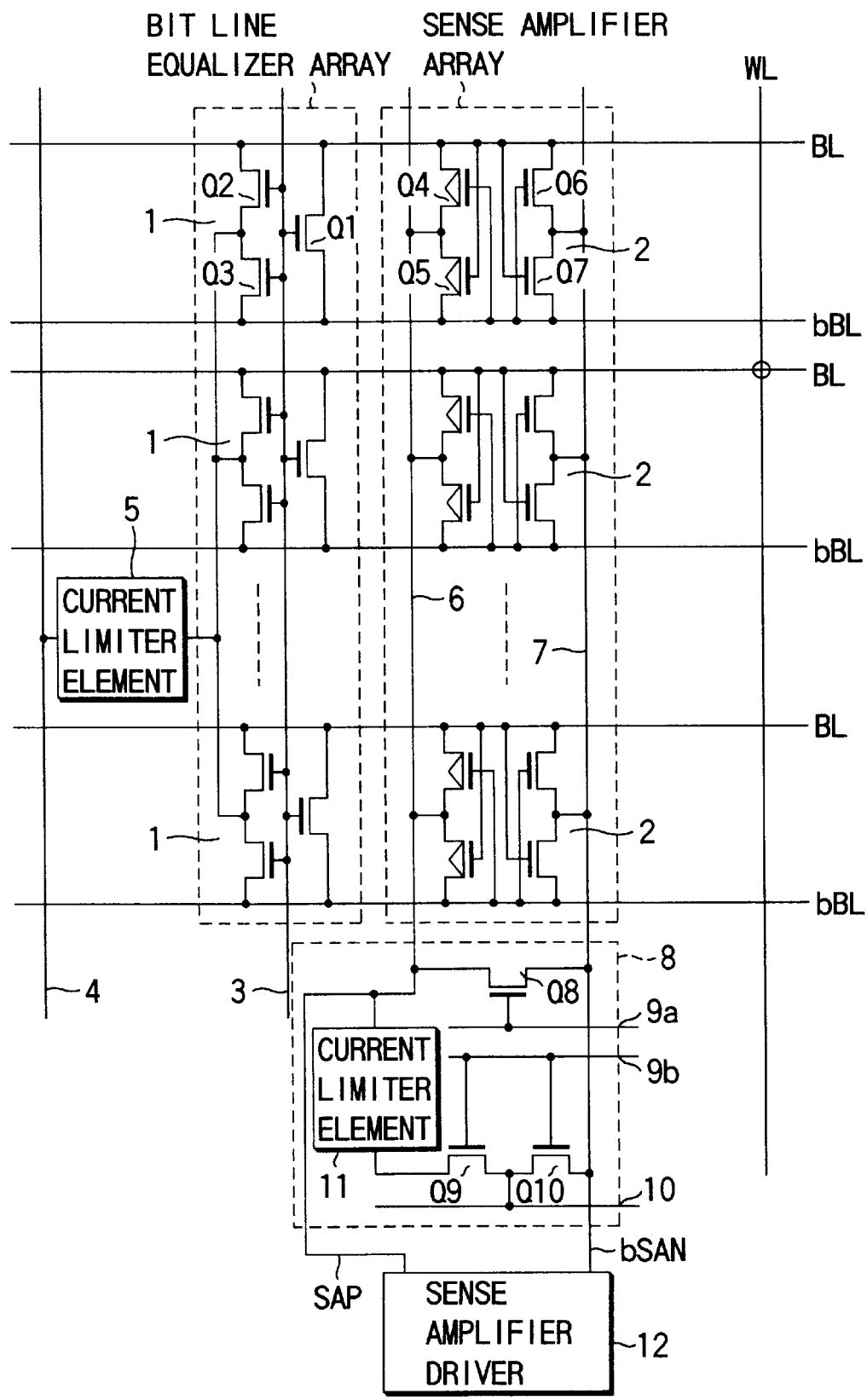
FIG. 6 is a circuit diagram showing a portion of DRAM semiconductor device according to a fourth embodiment of the present invention.

FIG. 6 shows a portion of a circuit arrangement of a DRAM semiconductor device according to a fourth embodiment of the present invention. This DRAM semiconductor device is different from that in FIG. 1 in that a sense amplifier drive line/equalizer control line 9 for controlling the operation of the above-mentioned sense amplifier drive line equalizer is divided into a sense amplifier drive line/equalizer control line 9a and sense amplifier drive line/equalizer control line 9b, that the gate of a MOS transistor Q8 is connected to the sense amplifier drive line/equalizer control line 9a and the gates of MOS transistors Q9 and Q10 are connected to the sense amplifier drive line/equalizer control line 9b, and that the current limiter element 11 is connected between one end of a P-channel sense amplifier drive line 6 side of a current path of the MOS transistor Q9 in the sense amplifier drive line/equalizer 8 and a P-channel sense amplifier drive line 6. Except in these different aspects, the FIG. 6 embodiment is similar to that of FIG. 1 and no further explanation is, therefore, omitted for brevity sake.

The operation of the present embodiment will be explained below in conjunction with FIG. 6.

Figure 7:
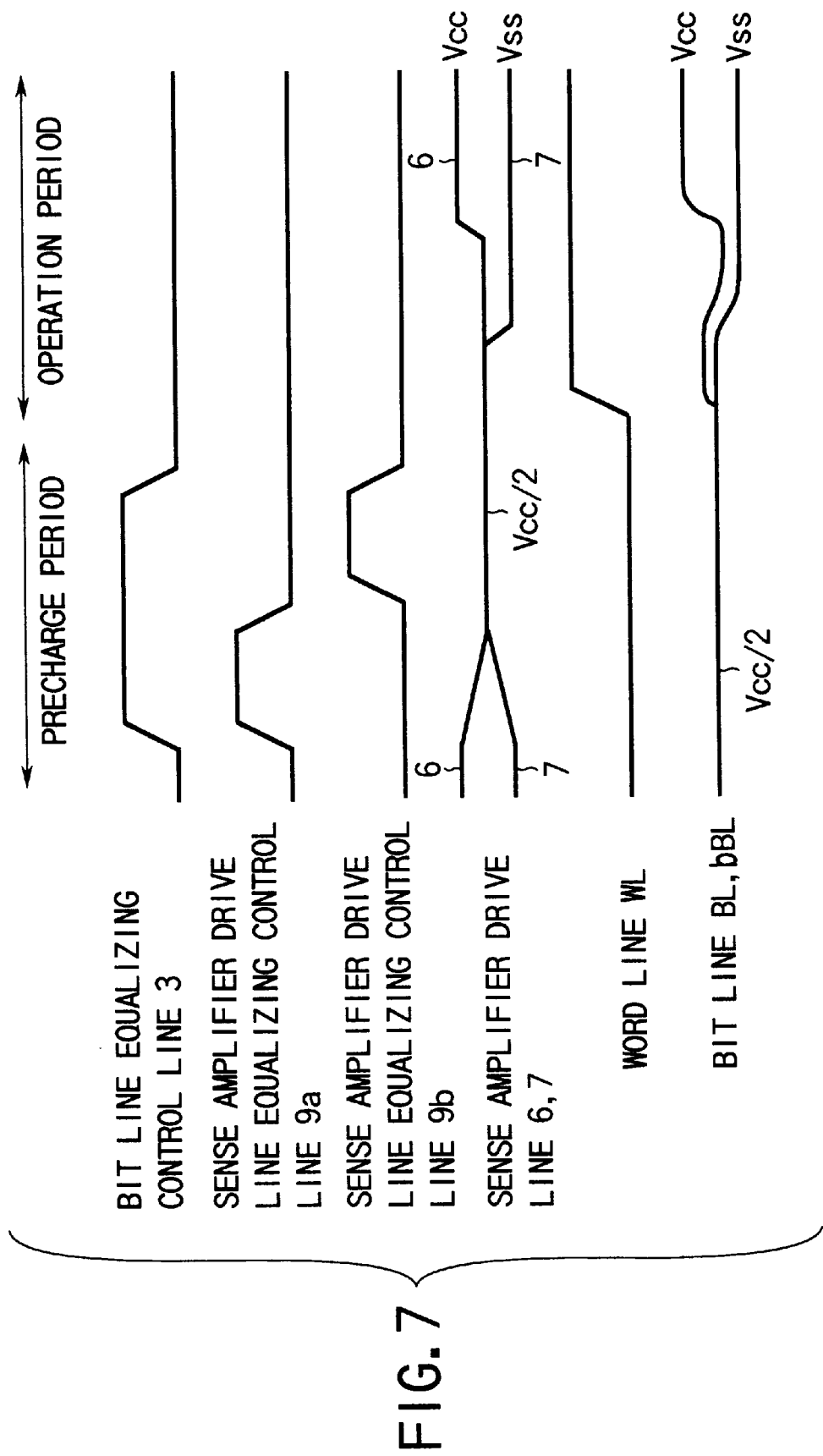
FIG. 7 shows a timing chart of a circuit operation when there occurs a cross-fail in the DRAM semiconductor device of FIG. 6.
Figure 8:
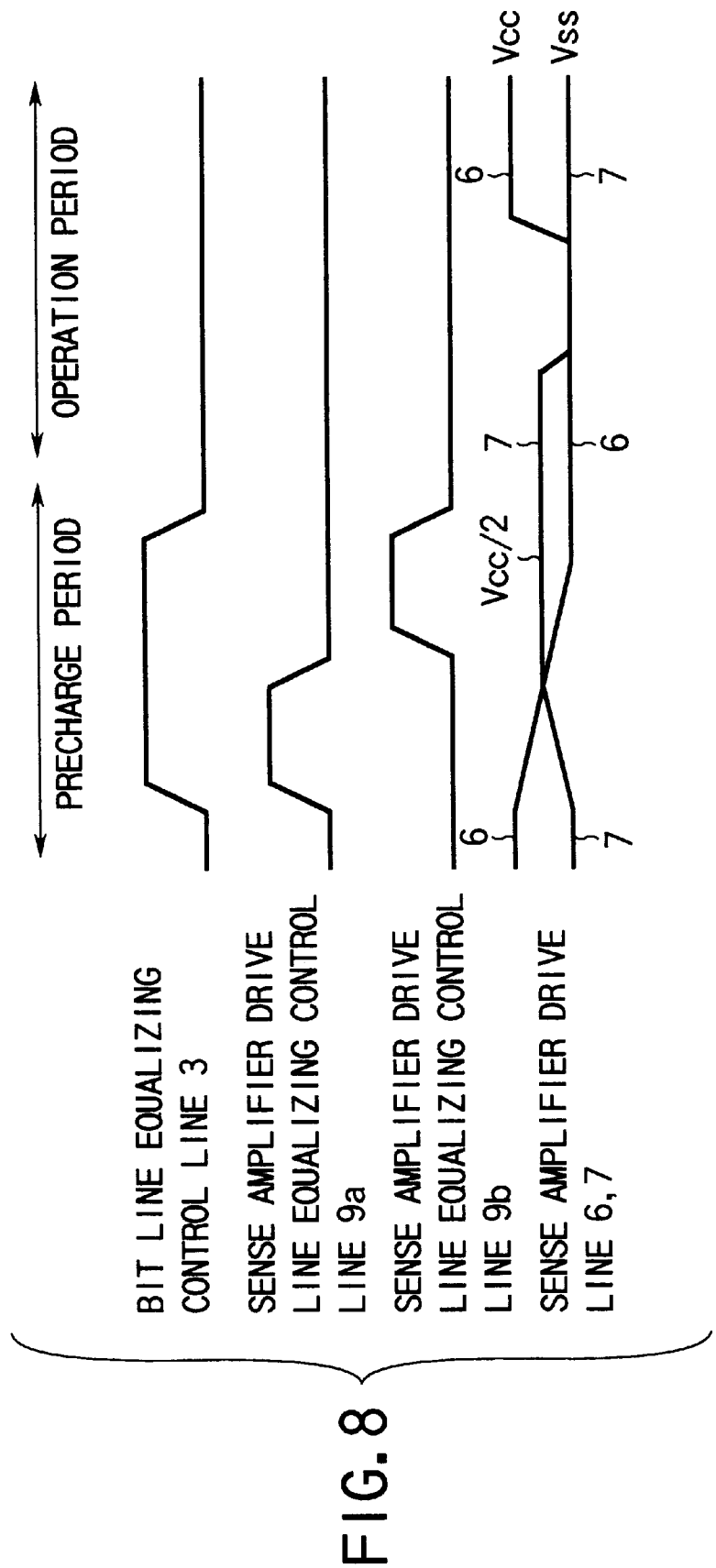
FIG. 8 is a timing chart of a circuit operation when a cross-fail occurs in the DRAM semiconductor device.

FIGS. 7 and 8, each, are a timing chart showing one form of operation, in the presence of a cross-fail and in the absence of such a cross-fail, both in conjunction with FIG. 6.

With reference to FIG. 7, an explanation will be given below about the case where there exists no cross-fail. First, when a signal on the bit line equalizer control line 3 rises to a "H" level at a precharging time period, the respective bit line equalizer circuit 1 is operated and the bit lines BL, bBL are precharged and equalized to a potential Vss/2. In this case, there exists no cross-fail, potentials on the bit lines BL, bBL are not lowered.

Further, at an initial given time portion of a precharge time interval, only a signal on the sense amplifier drive line equalizer control line 9a becomes a "H" level. Before this precharging time, sense amplifier drive lines 6, 7 are set to Vcc, Vss by drive signals SAP, bSAN output from the sense amplifier drive circuit 12, respectively. When a signal on the equalizer control line 9a rises to a "H" level, a MOS transistor Q8 in the sense amplifier drive line equalizer 8 is turned ON, thus short-circuiting the sense amplifier drive lines 6, 7 through the MOS transistor Q8. As a result, the potentials on the sense amplifier drive lines 6, 7 initially set by the drive signals SAP, bSAN to the Vcc, Vss become closer to each other and finally become a potential Vcc/2.

After a signal on the sense amplifier drive line/equalizer control line 9a falls to a "L" level, a signal on the sense amplifier drive line/equalizer control line 9b rises to a "H" level. Then MOS transistors Q9, Q0 in the sense amplifier drive line/equalizer 8 are turned ON and the sense amplifier drive lines 6, 7 are precharged by a precharge voltage on the precharging power source line 10. In this case, since there occurs no cross-fail, potentials on the sense amplifier drive lines 6, 7 never fall. And there is no flow of a larger short-circuiting current from the precharge power source line 10. Thereafter, a signal on the sense amplifier drive line/equalizer control line 9b drops to a "L" level and the precharging period is ended.

In the operation period it follows that, of those word lines WL set to the non-select voltage (Vss) at the precharging period, a signal on the select word line WL rises to a "H" level. By doing so, a memory cell (not shown) connected to the select word line WL is selected and, in accordance with memory data on the select memory cell, there occurs a very small potential difference between the corresponding bit lines BL and bBL.

By outputting a drive signal bSAN of a "L" level from the sense amplifier drive circuit 12, a signal on the sense amplifier drive line falls. And the N-channel sense amplifier in the respective sense amplifier circuit 2 starts its operation. When the N channel sense amplifier is operated, the potentials on the bit lines BL, bBL, both, decline toward Vss and their potential difference is expanded little by little.

Then by outputting the drive signal SAP of the H level from the sense amplifier drive circuit 12 a signal on the sense amplifier drive line 6 rises. By doing so, the P-channel sense amplifier in the respective sense amplifier 2 starts its operation. By operating the P-channel sense amplifier, a potential difference across the bit lines BL and bBL is enlarged to finally obtain the Vcc and Vss. And data is detected.

With reference to FIG. 8, an explanation will be given below about the operation when a cross-fail is present. The operation when, during the precharging period, a signal on the bit line/equalizer control line 3 and signal on the sense amplifier drive line/equalizer control line 9a are at the "H" level is similar to the case of FIG. 7. When the MOS transistor Q8 in the sense amplifier drive line equalizer 8 is turned ON and potentials on the sense amplifier drive lines 6 and 7 are closer to each other, the other MOS transistors Q9, Q10 are turned OFF and no current flows from the precharge current line 10.

Then when a signal on the sense amplifier drive line/equalizer control line 9a falls to a "L" level and a signal on the sense amplifier drive line/equalizer control line 9b rises to a "H" level, the MOS transistors Q9, Q10 in the sense amplifier drive line equalizer 8 are both turned ON and, by doing so, the precharging of the sense amplifier drive lines 6, 7 is started by the precharging voltage on the precharging power source line 10. In this case, since there exists a cross-fail, a potential on the sense amplifier drive line 6 falls as indicated and there is a flow of a short-circuiting current from the precharging power source line 10. Since, however, a current limiter element 11 is connected between the MOS transistor Q9 and the sense amplifier drive line 6, a small-level short-circuiting current flows out of the precharging current source 10.

In the operation period following a precharging period, after a signal on the select word line WL rises to a "H" level, a "L" level drive signal bSAN is output and then a "H" level drive signal SAP is output from the sense amplifier circuit 18 and, by doing so, the respective sense amplifier circuit 2 is driven.

In the DRAW semiconductor device shown in FIG. 6, the sense amplifier drive line/equalizer control line is divided into two, one for the sense amplifier drive line/equalizer control line 9a and the other for the sense amplifier drive line/equalizer control line 9b and different signals are supplied to both. Since only the MOS transistor Q8 in the sense amplifier drive line equalizer 8 short-circuiting the sense amplifier drive lines 6 and 7 is turned ON for an initial given portion of the precharging period and there occurs no loss of a charge in a charged state due to the equalizing involved. Even if there exists any cross-fail, no short-circuiting current flows from the precharging power source line 10 due to the presence of the current limiter element 11 and it is possible to reduce more standby current.

Here, the period in which a signal on the sense amplifier drive line/equalizer control line 9a is set to a "H" level needs only be made a period necessary to allow potentials on the sense amplifier drive lines 6, 7 to be adequately closer to Vcc/2. And the period in which a signal on the sense amplifier drive line/equalizer control line 9b is set to the "H" level is a period corresponding to a remaining portion of the precharge period.

Although, in FIGS. 7 and 8, the "H" level periods of the sense amplifier drive line/equalizer control line 9a and sense amplifier drive line/equalizer control line 9b have been explained as not being overlapped with each other, it may be possible to advance the "leading" timing of a signal on the sense amplifier drive line/equalizer control line 9b and have it partly overlap with the "trailing" edge of a signal on the sense amplifier drive line/equalizer control line 9a. In the partly overlapped period of the sense amplifier drive line/equalizer control line 9b and sense amplifier drive line/equalizer control line 9b, there is a possibility that a short-circuiting current will flow from the precharge power source line 10. Even in this case, a period in which a short-circuiting current flows is shorter than that in FIG. 1.

Figure 9:
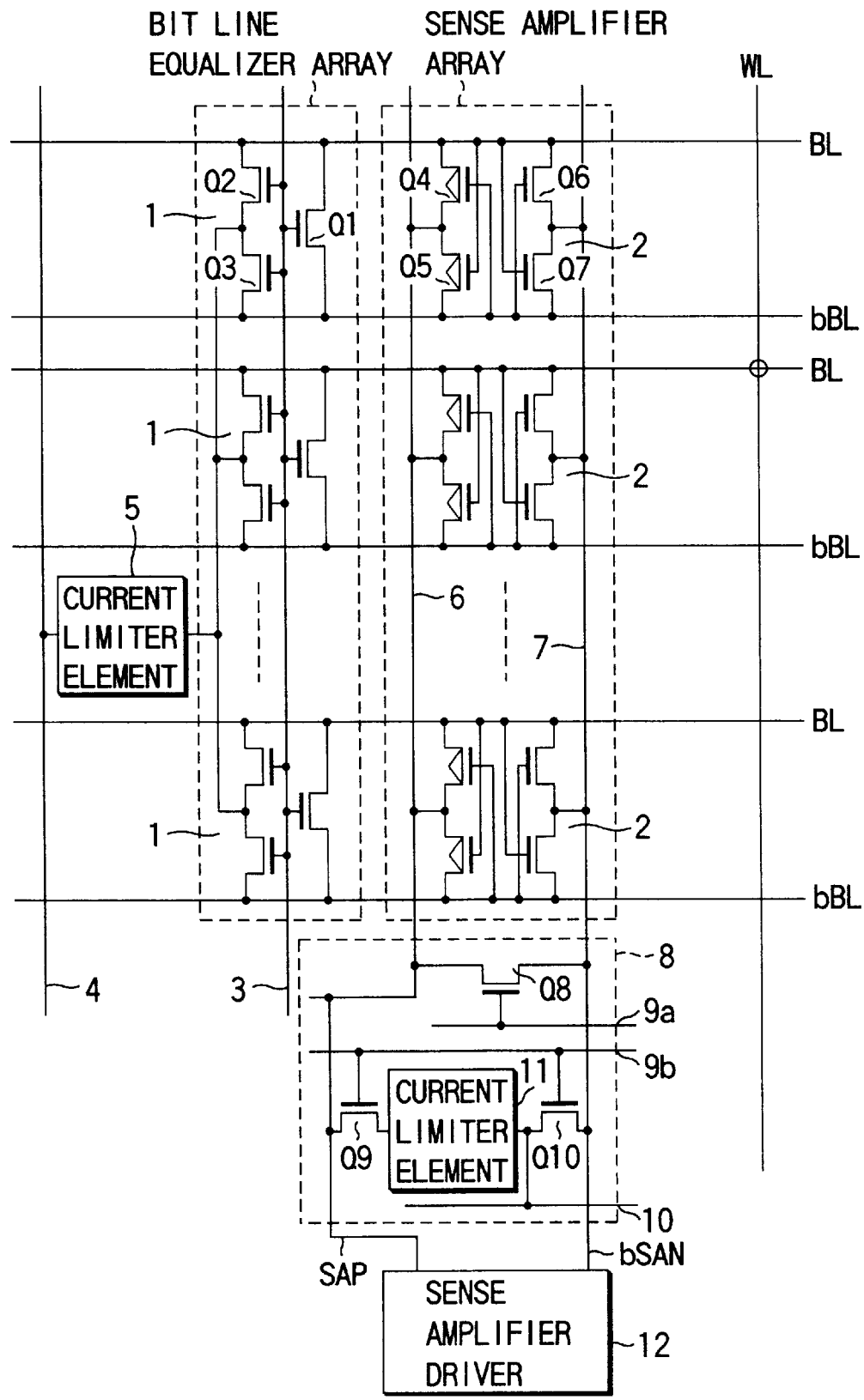
FIG. 9 is a circuit diagram showing a portion of a DRAM semiconductor device according to a fifth embodiment of the present invention.

FIG. 9 shows a circuit arrangement of a portion of a DRAM semiconductor device according to a fifth embodiment of the present invention. This circuit arrangement is different from that of FIG. 6 in that a current limiter element 11 is connected between one end of a precharge current source line 10 side of a current path of a MOS transistor Q9 in a sense amplifier drive line equalizer 8 and the precharging power source line 10. Except in this feature, this circuit arrangement is similar to that of FIG. 6 and any further explanation is, therefore, omitted for brevity sake.

The arrangement of FIG. 9 can also obtain an advantage similar to that of FIG. 6.

Figure 10:
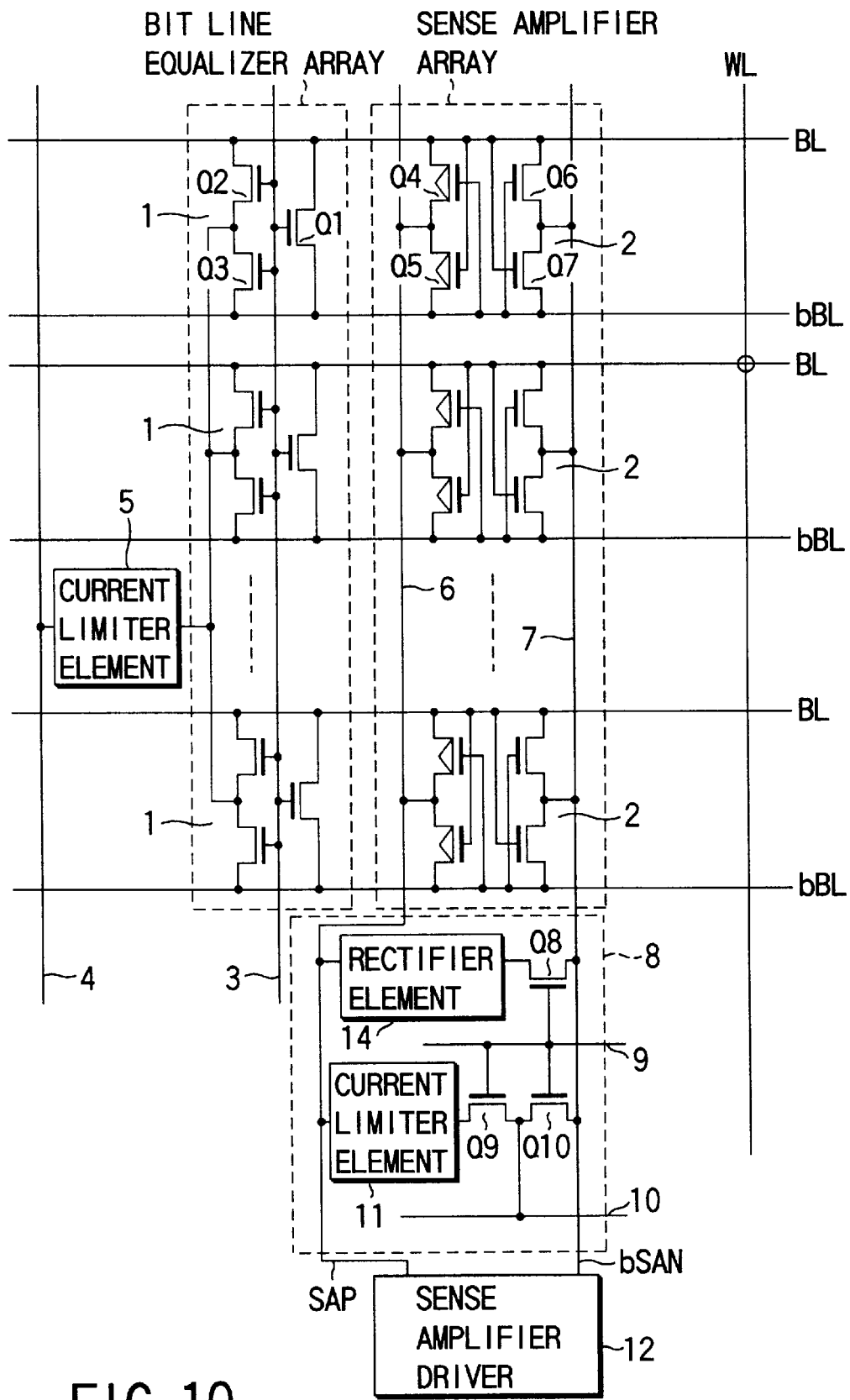
FIG. 10 is a circuit diagram showing a portion of a DRAM semiconductor device according to a sixth embodiment of the present embodiment.
Figure 11:
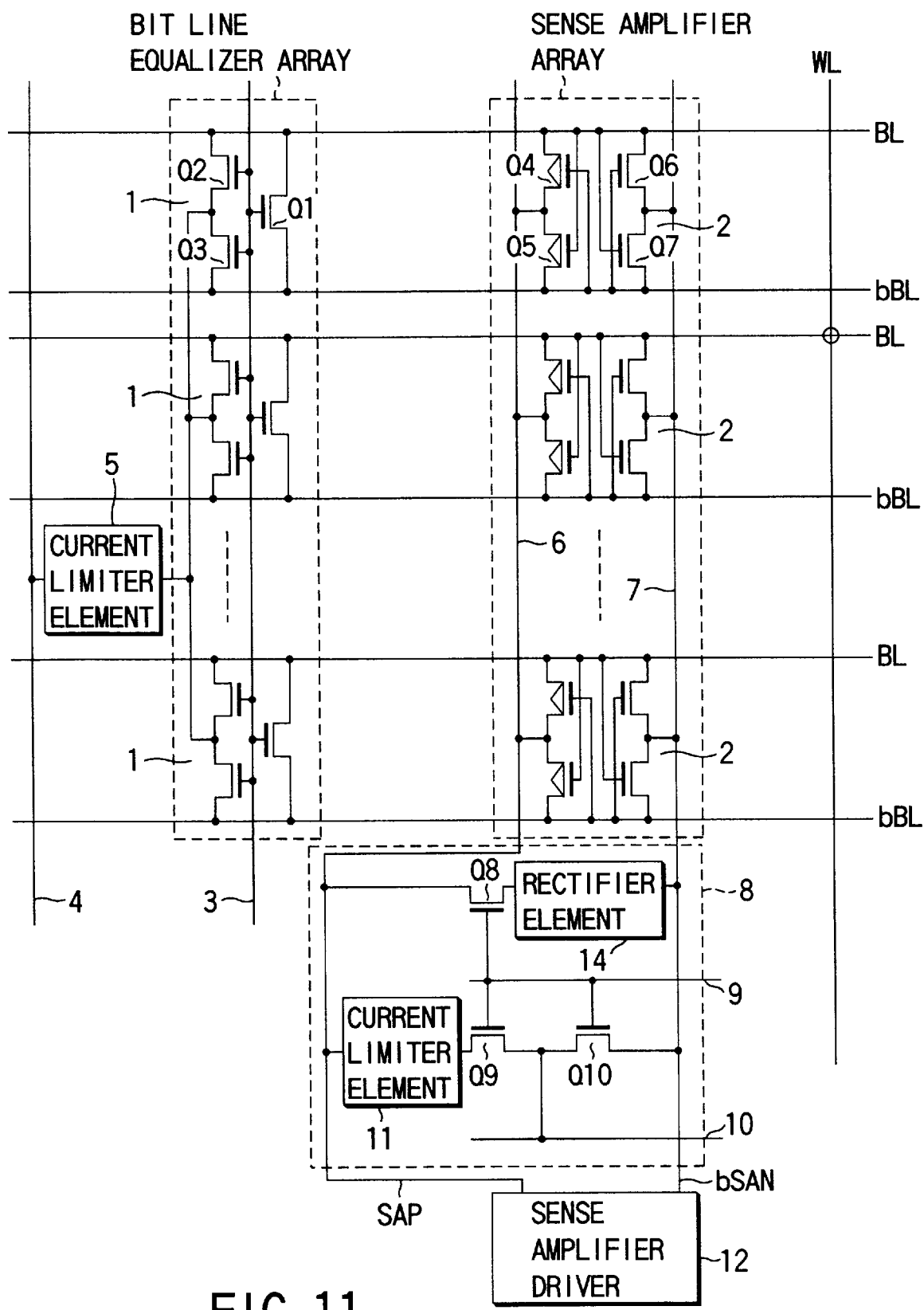
FIG. 11 is a circuit diagram showing a portion of a DRAM semiconductor device according to a seventh embodiment of the present invention.

FIG. 10 shows a circuit arrangement of one portion of a DRAM semiconductor device according to a sixth embodiment of the present invention. This circuit arrangement is different from that of FIG. 6 in that a rectifier element 14 is connected between one end of a sense amplifier drive line 6 side of a current path of a MOS transistor Q8 in the sense amplifier drive line equalizer 8 and a sense amplifier drive line 6 and that, instead of the sense amplifier drive line/equalizer control line 9a and sense amplifier drive line/equalizer control line 9b, use is made of a common control line 9. Except in these aspects, the arrangement of FIG. 10 is similar to that of FIG. 6.

The direction in which a current may flow through the rectifier element 14 is from the sense amplifier drive line 6 toward a sense amplifier drive line 7. When, at an initial given portion of the precharge period, the MOS transistor Q8 in the sense amplifier drive line equalizer 8 is turned ON, a current flows from the sense amplifier drive line 6 through the rectifier element 14 to the sense amplifier drive line 7 and, as set out in conjunction with the embodiment of FIG. 6, potentials on the sense amplifier drive lines 6 and 7 are set to Vcc/2. That is, at an initial given portion of the precharge period, a signal on the sense amplifier drive line/equalizer control line 9 is rendered at a "H" level. In a period preceding the precharge period, the sense amplifier drive lines 6 and 7 are set to Vcc and Vss by drive signals SAP and bSAN output from the sense amplifier drive circuit 12. When a signal on the equalize control line 9 rises to a "H" level, the MOS transistor Q3 in the sense amplifier drive line equalizer 8 is turned ON. As a result, the sense amplifier drive lines 6 and 7 are short-circuited and a current flows from the sense amplifier drive line 7 past the rectifier element 14 and MOS transistor Q8 to the sense amplifier drive line 7. And the potentials on the sense amplifier drive lines 6 and 7, which are set by the drive signals SAP and bSAN to Vcc and Vss, are closer to each other and are finally brought to a potential Vss/2.

Since, however, no current flows in a reverse direction, that is, in a direction from the sense amplifier drive line 7 toward the sense amplifier drive line 6, a cross-fail is present and, even if a potential on the sense amplifier drive line 6 becomes lower than Vcc/2, a potential on the sense amplifier drive line 7 is not affected.

Although the rectifier element 14 has been explained as being connected between the MOS transistor Q8 and the sense amplifier drive line 6, it may be connected between a MOS transistor Q8 and a sense amplifier drive line 7. As the rectifier element use can be made of, for example, a diode and a diode-connected MOS transistor.

Figure 12:
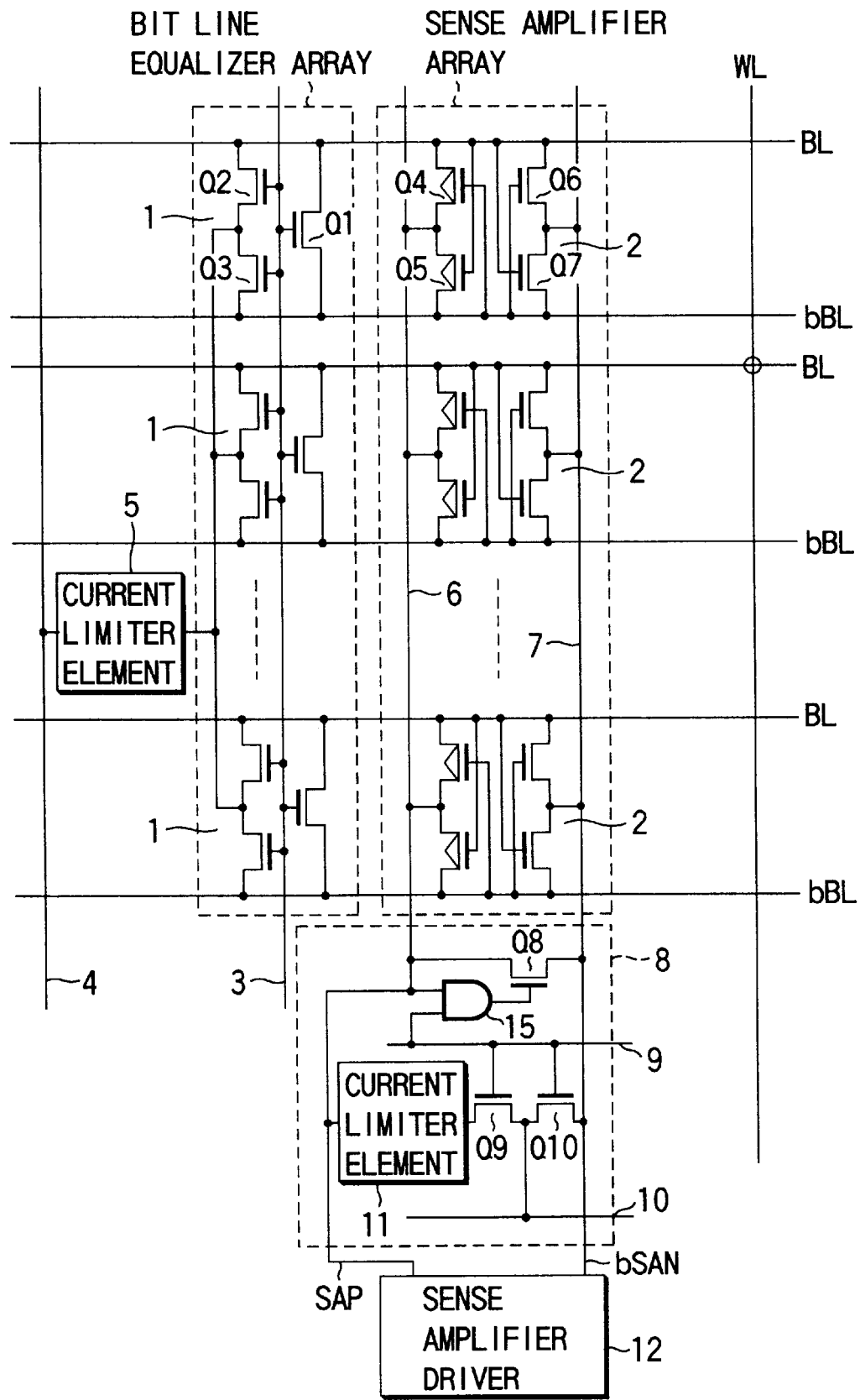
FIG. 12 is a circuit diagram showing a portion of a DRAM semiconductor device according to an eighth embodiment of the present embodiment.

FIG. 12 shows a circuit arrangement of a portion of a DRAM semiconductor device according to a seventh embodiment of the present invention. This DRAM semiconductor device is different from that of FIG. 6 in that, instead of the sense amplifier drive line/equalizer control line 9a and sense amplifier drive line/equalizer control line 9b, one common sense amplifier drive line/equalizer control line 9 is provided and an AND circuit 16 supplied with a signal on the sense amplifier drive line/equalizer control line 9 and signal on a sense amplifier drive line 6 has its output connected to the gate of a MOS transistor QS.

In this case, a signal maintained at a "H" level in the precharge time in the same way as in the DRAM semiconductor device in FIG. 1 is supplied to the sense amplifier drive line/equalizer control line 9.

When, in the DRAM semiconductor device shown in FIG. 12, a "H" level signal is supplied to the sense amplifier drive line/equalizer control line 9 during a precharge period, a signal potential on the sense amplifier drive line 6 which is previously set at a "H" level by a drive signal SAP from the sense amplifier drive circuit 12 enables an output of the AND circuit to be made at a "H" level during a period in which the "H" level is recognized by the AND circuit 15. As a result, the MOS transistor Q8 is turned ON. When, as indicated by the timing chart in FIGS. 7 and 8, the potential on the sense amplifier drive line 6 falls and the level on the sense amplifier drive line 6 becomes lower as indicated by the timing chart of FIG. 8, that is, the level thereon ceases to be recognized by the AND circuit 15, the output of the AND circuit 15 is made at a "L" level, so that the MOS transistor Q8 is cut off.

By providing such an AND circuit 15 it is possible to perform a similar operation to the case where the sense amplifier drive line/equalizer control line 9a and sense amplifier drive line/equalizer control line 9b are both provided as shown in FIG. 6 and different signals as shown in FIGS. 7 and 8 are supplied.

According to the present invention, as set out above, it is possible to provide a semiconductor memory device which, even if there occurs a cross-fail across the bit line and the word line, can reduce a short-circuiting current at the precharging time, or prevent the generation of a short-circuiting current, and reduce a standby current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
paired bit lines;
a sense amplifier circuit, connected to the paired bit lines, for amplifying a potential difference on the paired bit lines and detecting data;
paired drive signal lines for transmitting a sense amplifier drive signal which drives the sense amplifier circuit to the sense amplifier circuit;
a drive signal line equalizer for setting the potential on the paired drive signal lines to a first potential; and
a current limiter element between a power potential source of the first potential and the paired drive signal lines, the current limiter element connected in series with a current path of the drive signal line equalizer.

2. A semiconductor memory device according to claim 1, wherein an operation of the current limiter element is controlled in accordance with a control signal.

3. A semiconductor memory device according to claim 2, wherein the control signal is constituted by a column select signal.

4. A semiconductor memory device comprising:
paired bit lines;
a bit line equalizer for setting a potential on the paired bit lines to a first potential;
a sense amplifier connected to the paired bit lines and having a P-channel sense amplifier comprised of P-channel transistors and an N-channel sense amplifier comprised of N-channel transistors, the sense amplifier circuit amplifying a potential difference created between the paired bits and detecting data;
a first drive signal line for transmitting a first drive signal driving the P-channel sense amplifier to the P-channel sense amplifier;
a second drive signal line for transmitting a second drive signal driving the N-channel sense amplifier to the N-channel sense amplifier;
a drive signal line equalizer including a first transistor having a source/drain current path inserted between the first drive signal line and a second drive signal line and supplied at a gate with a third drive signal, a second transistor having a source/drain current path inserted between the first drive signal line and a first potential source of a first potential and supplied at a gate with a fourth drive signal, and a third transistor having a source/drain current inserted between the second drive signal line and a power potential source of the first potential and supplied at a gate with the fourth drive signal; and
a current limiter element between the first drive signal line and the potential source of the first potential, the current limiter element inserted in series with a source/drain current path of the second transistor.

5. A semiconductor memory device according to claim 4, further comprising a rectifier element which, between the first drive signal line and the second drive signal line, is inserted in series with the source/drain current path of the first MOS transistor.

6. A semiconductor memory device according to claim 4, wherein the fourth drive signal is supplied to the gates of the second and third MOS transistors in order to prevent an overlap of ON periods of the second and third MOS transistors with an ON period of the first MOS transistor.

7. A semiconductor memory device comprising:
paired bit lines;
a sense amplifier circuit connected to the paired bit lines and having a P-channel sense amplifier of P-channel transistors and N-channel sense amplifiers of N-channel transistors, the sense amplifier circuit amplifying a potential difference across the paired bit lines and detecting data;
a first drive signal line for transmitting a first drive signal for driving the P-channel sense amplifier to the P-channel sense amplifier;
a second drive signal line for transmitting a second drive signal for driving the N-channel sense amplifier to the N-channel sense amplifier;
a drive signal line equalizer including a first transistor having a source/drain current path connected between the first drive signal line and the second drive signal line, a second transistor having a source/drain current path connected between the first drive signal line and a potential source of a first potential and supplied at a gate with a third drive signal, a third transistor having a source/drain current path connected between the second drive signal line and the potential source of the first potential and supplied at a gate with a third drive signal, and a logic circuit driving the gate of the first transistor in accordance with the third drive signal and a signal on the first drive signal line and generating a fourth drive signal; and a current limiter element between the first drive signal line and the potential source of the first potential, the current limiter element connected in series with the source/drain current path of the second transistor.

8. A semiconductor memory device further comprises a rectifier element between the pair drive signal lines.

9. A semiconductor memory device according to claim 1, wherein the memory device further comprises a bit line equalizer for setting a potential on the paired bit lines to a second potential, and a second current limiter between a power potential source of the second potential and the paired bit lines, the second current limiter connected in series with a current path of the bit line equalizer, wherein the second limiter circuit is controlled by the control signal.

10. A semiconductor memory device according to claim 9, wherein the control signal is a column selection signal.

11. A semiconductor memory device according to claim 4, wherein the first transistor is controlled to be turned ON only during an initial given portion of a precharging period.

12. A semiconductor memory device according to claim 4, wherein an operation of the current limiter element is controlled in accordance with a control signal.

13. A semiconductor memory device according to claim 12, wherein the control signal is a column selection signal.

14. A semiconductor memory device according to claim 12, wherein the memory device further comprises a bit line equalizer for setting a potential on the paired bit lines to a second potential, and a second current limiter between a power potential source of the second potential and the paired bit lines, the second current limiter connected in series with a current path of the bit line equalizer, wherein the second limiter circuit is controlled by the control signal.

15. A semiconductor memory device according to claim 14, wherein the control signal is a column selection signal.

16. A semiconductor memory device according to claim 7, wherein the logic circuit controls the first transistor to be turned ON, only during an initial given portion of a precharging period.

17. A semiconductor memory device according to claim 7, wherein an operation of the current limiter element is controlled in accordance with a control signal.

18. A semiconductor memory device according to claim 17, wherein the control signal is a column selection signal.

19. A semiconductor memory device according to claim 17, the memory device further comprises a rectifier element provided between the first drive signal line and the second drive signal line.

20. A semiconductor memory device according to claim 17, the memory device further comprises a bit line equalizer for setting the potential on the bit line pair to a second potential, and a second current limiter element between a power potential source of the second potential and the bit line pair, the second current limiter element connected in series with a current path of the bit line equalizer, wherein the second current limiter element is controlled by the control signal.

21. A semiconductor memory device according to claim 20, wherein the control signal is a column selection signal.

22. A semiconductor memory device according to claim 2, wherein the control signal includes a signal for stopping the operation of the current limiter element.

23. A semiconductor memory device according to claim 12, wherein the control signal includes a signal for stopping the operation of the current limiter element.

24. A semiconductor memory device according to claim 17, wherein the control signal includes a signal for stopping the operation of the current limiter element.

25. A semiconductor memory device according to claim 5, wherein the rectifier element rectifies a current flowing from the first drive signal line toward the second drive signal line.

26. A semiconductor memory device according to claim 8, wherein the rectifier element rectifies a current flowing from the first drive signal line toward the second drive signal line.

27. A semiconductor memory device according to claim 19, wherein the rectifier element rectifies a current flowing from the first drive signal line toward the second drive signal line.

* * * * *